United States Patent [19]
Sato et al.

[11] Patent Number: 5,444,300
[45] Date of Patent: Aug. 22, 1995

[54] SEMICONDUCTOR APPARATUS WITH HEAT SINK

[75] Inventors: Hiroya Sato; Masato Miyauchi, both of Tenri, Japan

[73] Assignee: Sharp Kabushiki Kaisha, Osaka, Japan

[21] Appl. No.: 925,785

[22] Filed: Aug. 7, 1992

[30] Foreign Application Priority Data

Aug. 9, 1991 [JP] Japan .................. 3-200184

[51] Int. Cl.⁶ .............. H01L 23/48; H01L 29/44; H01L 29/52; H01L 29/60
[52] U.S. Cl. .............................. 257/737; 257/706; 257/778; 257/587; 361/709
[58] Field of Search ............ 257/737, 584, 587, 578, 257/707, 778, 773, 666, 780, 786, 796; 361/707, 709, 712

[56] References Cited

U.S. PATENT DOCUMENTS

| | | | |
|---|---|---|---|
| 3,567,506 | 3/1971 | Belardi | 437/192 |
| 3,614,832 | 10/1971 | Chance et al. | 257/780 |
| 3,828,229 | 8/1974 | Anazawa | 257/778 |
| 4,764,804 | 8/1988 | Sahara et al. | 257/737 |
| 4,937,653 | 6/1990 | Blonder et al. | 257/666 |
| 5,084,751 | 1/1992 | Iwata et al. | 257/579 |
| 5,109,270 | 4/1992 | Nambu et al. | 257/773 |
| 5,143,865 | 9/1992 | Hideshima et al. | 437/183 |
| 5,216,279 | 6/1993 | Nakao | 257/690 |
| 5,285,352 | 2/1994 | Pastore et al. | 361/707 |

FOREIGN PATENT DOCUMENTS

| | | | |
|---|---|---|---|
| 47-36858 | 11/1972 | Japan . | |
| 48-69471 | 9/1973 | Japan . | |
| 51-22346 | 7/1976 | Japan . | |
| 54-159865 | 12/1979 | Japan . | |
| 60-175444 | 9/1985 | Japan | 257/780 |
| 33335 | 1/1991 | Japan . | |

OTHER PUBLICATIONS

Ultrahigh Power Efficiency Operation of Common-Emitter and Common-Base HBT's at 10 GHz by N. L. Wang et al., from IEEE Transactions on Microwave Theory and Techniques, vol. 38, No. 10, Oct. 1990, pp. 1381-1389.
10-GHz 10-W Internally Matched Flip-Chip GaAs Power FET's by Yasuo Mitsui et al., from IEEE Transactions on Microwave Theory and Techniques, vol. MIT-29, No. 4, Apr. 1981, pp. 304-309.
Carbon-Doped AlGaAs/GaAs HBTs with $f_{max}=117$GHz Grown by MOCVD by Hiroya Sato et al., Electronic Communication Society Technical Research Report ED90—135, Jan. 17, 1991, pp. 19-24.
"Controlled Collapse Reflow Chip Joining", L. F. Miller, May 1969 pp. 235-250.
"Flip-Chip Microcircuit Bonding Systems", T. R. Myers, ITT Research Institute, Electronics Research Division, Chicago Illinois, pp. 131-144.
"ICs on strip lend themselves to automatic handling by manufacturer and user, too", Stephen E. Scrupski, *Electronics*, Feb. 1, 1971, pp. 44-48.
"Tape Automated Bonding Process For High Lead Count", 1983 IEEE, pp. 221-226.

*Primary Examiner*—Robert P. Limanek
*Assistant Examiner*—T. M. Arroyo

[57] ABSTRACT

A semiconductor apparatus is provided which includes a semiconductor chip on its one plane with a plurality of terminal electrodes, which are divided into a plurality of bundles, a bump provided on one of the bundles of terminal electrodes, a connect member of heat conductivity having a plane connected with the plane of the bump, and other connect members for connecting the other bundles of terminal electrodes regardless of the connect member. As a result, the terminal resistance of the semiconductor apparatus is considerably reduced.

8 Claims, 5 Drawing Sheets

SEMICONDUCTOR APPARATUS WITH HEAT SINK

BACKGROUND OF THE INVENTION

The present invention generally relates to a semiconductor apparatus, and more particularly, to a semiconductor apparatus with a semiconductor chip of larger construction power density being mounted on the semiconductor apparatus, and a method for manufacturing thereof.

Generally, consumption power per semiconductor chip increases steadily as semiconductor art presently develops. Especially, a demand for transistors for power amplification use in a microwave band increases, and a low cost mounting art capable of high efficiency of radiation which can be used for the semiconductor apparatus has an urgent necessity for being established. The following method is proposed broadly as a mounting method capable of being used with the semiconductor apparatus.

a) PHS (Plated Heat Sink) N. L. Wang et al., IEEE Trans. on "Microwave Theory and Technol.", vol. 38, No. 10, pp. 1381–1389

A means for releasing heating of a splicing portion of a semiconductor chip onto the basic plate reverse face side of the basic plate is adopted in the above described document. Namely, (1) a semiconductor basic plate is cut thin, and (2) a via hole extending onto the basic plate surface side from the basic plate reverse face side is provided immediately under an electrode drawn out onto the periphery of the semiconductor chip from the splicing portion, with a metallic material which is good in thermal conductivity being buried in the via hole.

b) Flip Chip

1) A method for forming a bump electrode to be mounted on a flip chip after the basic plate is made in a thin layer, and, radiating by way of a case cap or the like with the use of, for example, heating solder or the like from the reverse face of an element basic plate is well known as disclosed in Japanese Patent Application Publication No. Sho 62-249429 (unexamined).

Generally an insulating material such as a ceramic and the like is used as a connecting member for externally transmitting the heat from the element basic plate. That is why the bump is required to function as a plurality of electrodes which are different in electric role and a wiring pattern for connecting the outside with them is required to be supported on the same plane face without being short-circuited as all the top faces of the semiconductor chip mounted by the inversion are covered with the connecting member.

Heat transmitted to the reverse face of the semiconductor chip is radiated partially into the open air by way of a package cap, and the majority of the heat is transmitted to the lower portion by way of the above described connecting member, and is radiated externally. Most of the thermal resistance is transmitted to the lower portion by way of the above described connecting member and is prescribed with ease of external radiation. A member to be thermally connected with the reverse face of the chip serves for a package cap so that the member is made larger than the chip so as to retain the positional alignment roof. Therefore, the distance between the chip and the position where the member is spliced with the above described connection member is large.

2) A method of assembling a metallic heat sink and an insulating basic plate provided adjacently to the metallic heat sink with -the height thereof being arranged, and further, mounting a flip chip is well known as disclosed by Y. Mitsui, et al., IEEE Trans. on "Microwave Theory and Technol.", vol. MTT-29, No. 4, pp. 304–309.

The above described conventional method a) has disadvantages as follows.

i) As the basic plate is cut in, and further, the via hole is opened, a crack notch is caused in a wafer so as to reduce the yield.

ii) The via hole is subject to restriction in the working precision so as to be separated by at least 5 $\mu$m or more from the splicing portion, i.e., heating location. Therefore, it is difficult to effectively reduce the thermal resistance.

iii) In the microwave band, an outgoing line from the splicing portion has non-negligible inductance. The outgoing line functions as feedback inductance and has loss.

The above described convention method b) 1) has disadvantages as follows. p1 i) As the connecting member has no choice but to become an insulating material, the thermal conductivity is inferior. It is difficult to considerably reduce the thermal resistance caused due to the connecting member.

ii) As the distance between the chip and the position where the member to be thermally connected with the reverse face of the chip is connected with the connecting member is larger, it is difficult to sharply reduce the thermal resistance caused by this distance.

iii) A wiring pattern for electrically connecting the bumps to each other or the outside is required to be provided on the side of the connecting member, thus causing higher cost.

iv) As the working precision is worse when the wiring pattern is provided chiefly by thick film printing to the ceramic on-the side of the connecting member, it is difficult to refine the pattern.

v) As a wiring pattern exists on the connecting member, and the high positional alignment accuracy with respect to wiring pattern is required, the cost becomes higher.

The above described conventional method b) 2) has disadvantages as follows.

i) It is very difficult in art accompanied by differences etc. in thermal expansion coefficient to assemble, with the height thereof being aligned in order to provide completely the bump connection, a metallic heat sink, mainly, non-oxygen-copper used as the superior thermal conductivity and an insulating basic plate, mainly, ceramics, adjacent to the bump connection, thus resulting in higher cost.

ii) As a specific bump has to be bonded on a specific position in the mounting operation of the flip chip, the yield is lowered, thus resulting in higher cost.

Therefore, it is difficult to put it to practical use due to such problem points as mentioned above.

SUMMARY OF THE INVENTION

Accordingly, the present invention has been developed with a view to substantially eliminate the above discussed drawbacks inherent in the known apparatus and has for its essential object to provide an improved semiconductor apparatus.

According to a preferred embodiment of the present invention, a semiconductor apparatus comprises a semiconductor chip provided on its one plane with a plurality of terminal electrodes to be connected, the plurality of terminal electrodes being divided into three bundles for emitter, collector and base, a bump provided on the bundle for emitter terminal electrodes, a connect member of heat conductivity having a plane connected with the plane of the semiconductor chip by the bump, the other two bundles of collector and base terminal electrodes being positioned outside of the connect member not to be covered by the connect member, and two wires for wire-bonding connected respectively with the two bundles of collector and base terminal electrodes to first and second ports.

In another preferred embodiment of the present invention, a semiconductor apparatus comprising a semiconductor chip provided on its one plane with a plurality of terminal electrodes to be connected, the plurality of terminal electrodes being divided into three bundles for emitter, collector and base, a base having a recess for mounting the semiconductor chip therein with the one plane disposed to the outside of the recess so as to position the plurality of bundles to be able to connect, the base provided with two ports for drawing out the base and collector terminals of the semiconductor chip to the outside, a bump provided on the bundle for emitter terminal electrodes, a connect member of heat conductivity having a plane connected with the plane of the bump, the other two bundles of collector and base terminal electrodes being positioned outside of the connect member not to be covered by the connect member, and two wires for wire-bonding connected respectively with the two bundles of collector and base terminal electrodes and the two ports of base regardless of the connected member.

According to the present invention, a method is provided for manufacturing a semiconductor apparatus comprising the steps of providing a semiconductor chip having on its one plane a plurality of terminal electrodes which are divided into three bundles of emitter, collector and base, mounting the semiconductor chip into the recess of a base upon disposing the one plane of the semiconductor chip to the outside so as to position the bundles to be able to connect, providing a bump onto the bundle of emitter terminal electrodes, connecting the plane of a connect member having heat conductivity with the plane of the bump, while the other two bundles of collector and base terminal electrodes are positioned outside of the connect member so as not to be covered by the connect member, connecting the connect member and base, connecting other connect members with the other collector and base terminal electrodes regardless of the connect member, and connecting the other connect members onto the base for insulating the connect member from the other connect members.

Another important object to the present invention is to provide an improved semiconductor apparatus of the type referred to above, where a semiconductor chip is mounted so that a plane face for connecting the bump to the highest portion of the normally positioned (not inverted) semiconductor chip may be put into approximate conformity with the connecting face immediately adjacent to the semiconductor chip, and the bump is connected with the connecting face with the use of the connecting member. Also, a portion whose immediate top is not covered with the above described connecting member is provided on the above described semiconductor chip, and a means for drawing out electrodes from the non-covered-portion is provided.

Also, the connecting face is desirable to exist adjacent to the long side of the semiconductor chip.

Additionally, the connecting face is desirable to be thermally or integrally in conduction with respect to the face connecting with the reverse face of the semiconductor chip.

Furthermore, the bump electrode is desired to be composed of metal having a thermal conductivity better than tin - lead alloy.

Also, the connecting member is desirable to be composed of a material better in thermal conductivity.

Additionally, the connecting member is desirable to be composed of a metallic plate.

Furthermore, a plastic material is desirable to be used for splicing between the connecting member and the connecting face. Also, the plastic material to be used for the splicing between the connecting member and the connecting face is desired to be composed of a material better in thermal conductivity.

Also, the grounding area between the bump electrode and the connecting member is desirable to be larger as compared with the grounding areas to the semiconductor chip of the bump electrode after the connecting member has been connected with the semiconductor chip.

Such a connecting face immediately adjacent to the semiconductor chip as to become approximately conformable to a plane for connecting the bump to the highest portion of the normally positioned semiconductor chip is provided so as to connect the bump with the connecting face with the use of the connecting member has the following advantages.

a) The normal positioning of the semiconductor chip makes it possible to use the electrode connecting means having a lower price, and higher in reliability as will be described later.

b) Heating from a device made on the semiconductor chip surface is radiated by way of the bump→ the connecting member→ the connecting face. Accordingly, the connecting face is brought into approximate proximity with respect to the semiconductor chip and brings the contraction of the thermal route and the reduction of the thermal resistance.

c) To bring the connecting face into approximate conformity with a plane for connecting the bump to the highest portion considerably simplifies the working of the connecting member for connecting them and the positional alignment.

d) The connecting member constitutes one portion of the radiating route described in the paragraph a) above. Also, the connecting member may be used as an electrode.

e) When the semiconductor chip is mounted, the end portion of the connecting face becomes a "guide", and the positional alignment accuracy is improved if a special means is not provided.

To have a portion, whose immediate top is not covered by the connecting member, on the semiconductor chip and to have a means for drawing out an electrode from the non-covered-portion has the following advantages.

a) A portion not covered on the immediate top of the chip is the easiest portion for drawing out the electrode. Accordingly, the electrode connecting means, which is lower in price and higher in reliability is drawn out by, for example, a method of wire bond or the like.

b) By electrode connecting means which does not rely upon the connecting member, the bump does not necessarily require functions as a plurality of electrodes different from the electric role. Accordingly, the connecting member is not required to be supported on the same plane without short-circuiting the wiring pattern for connecting them with the outside. Thus, the material quality of the connecting member can be freely selected. Also, the wiring pattern and so on are not required to be built in by the working operation on the connecting member itself.

Existence of the connecting face adjacent to the long side of the semiconductor chip is effective in shortening the route of radiating through the connecting member and the connecting face from the heating source and in reducing the thermal resistance. At the same time, a portion whose immediate top is not covered is easy to provide.

That the connecting face is better in integral or thermal conduction with respect to the member for connecting with the reverse face of the semiconductor chip unifies the heat sink by the joint ownership, thus reducing the parts cost and assembling cost.

That the bump electrode is composed of a material better in thermal conductivity than tin - lead alloy is effective in reduction of the thermal resistance on the route to the bump→ the connecting member→ the connecting face→ the outside.

That the connecting member is composed of a material better in thermal Conductivity is effective in reducing the thermal resistance on the route to the bump → the connecting member→ the connecting face→ the outside.

The connecting member composed of a metallic plate is effective in the reduction of the thermal resistance. At the same time, the connecting member can be used as the electrode without special working operation.

The use of the plastic material in the splicing between the connecting member and the connecting face absorbs the slight "unstability" caused by the dispersion of working assembling precision so as to increase adherence, and is effective in reduction of the thermal resistance, improvements in yield and reliability, and reduction in cost.

The use of a material better in thermal conductivity as a plastic material to be used in the splicing between the connecting member and the connecting face is effective in further reduction of the thermal resistance.

Also, the larger grounding area between the bump electrode and the connecting member as compared with the grounding area to the semiconductor chip of the bump electrode after the connection between the connecting member and the semiconductor chip is effective in the reduction of the thermal existence of the bump without an increase in the parasitic capacity of the bump at the immediate bottom.

The thermal resistance can be considerably reduced by the above described effect. Thus, the process margin increases, and the semiconductor apparatus being low in thermal resistance is better in yield so that the forming operation can be effected at a low cost.

BRIEF DESCRIPTION OF THE INVENTION

These and other objects and features of the present invention will become apparent from the following description taken in conjunction with the preferred embodiment thereof with reference to the accompanying drawings, in which.

DETAILED DESCRIPTION OF THE INVENTION

Before the description of the present invention process, it is to be noted that like parts are designated by like reference numerals throughout the accompanying drawings.

Figure 1:
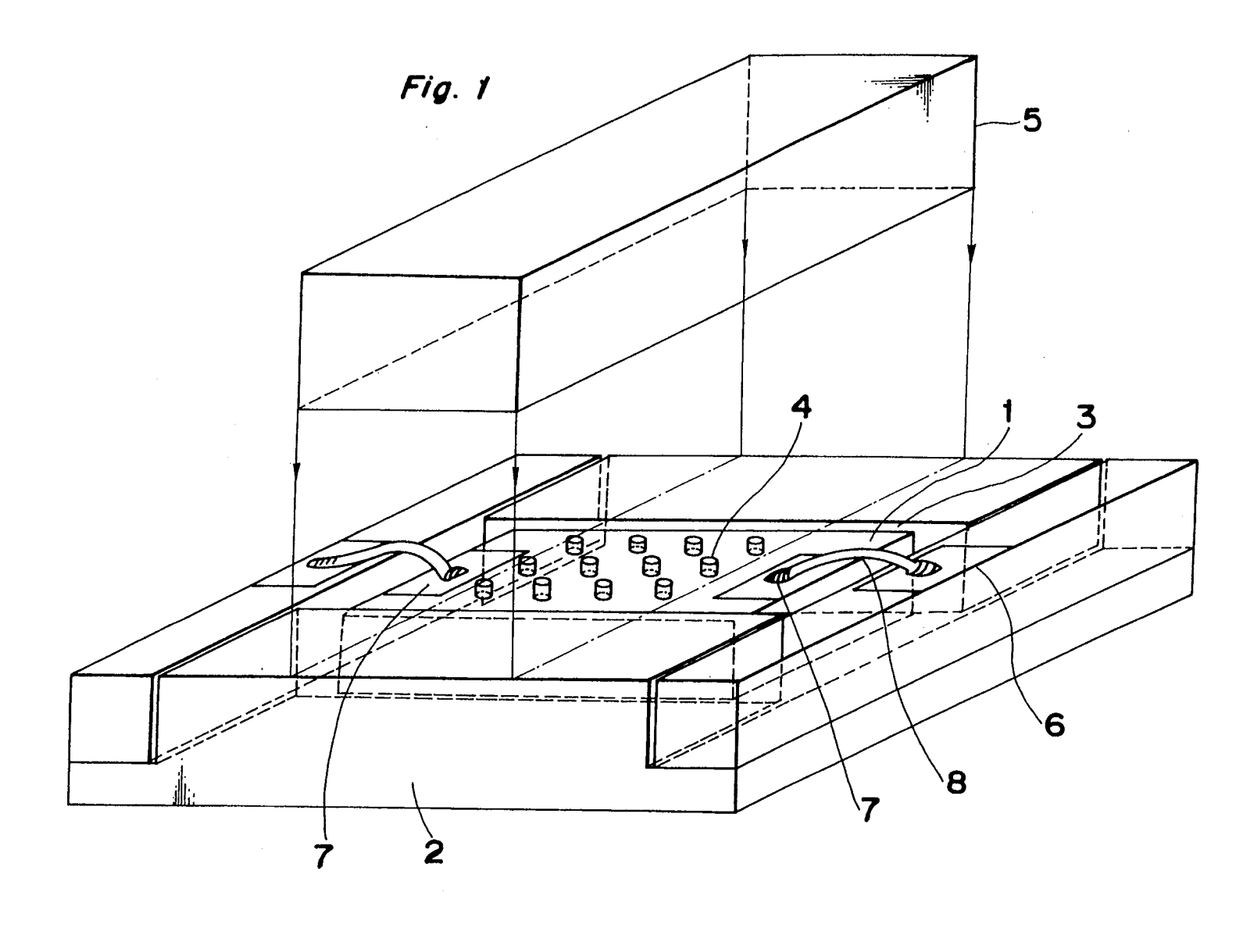
FIG. 1 is a perspective view, partly exploded, showing a semiconductor apparatus in accordance with a first embodiment of the present invention.
Figure 2:
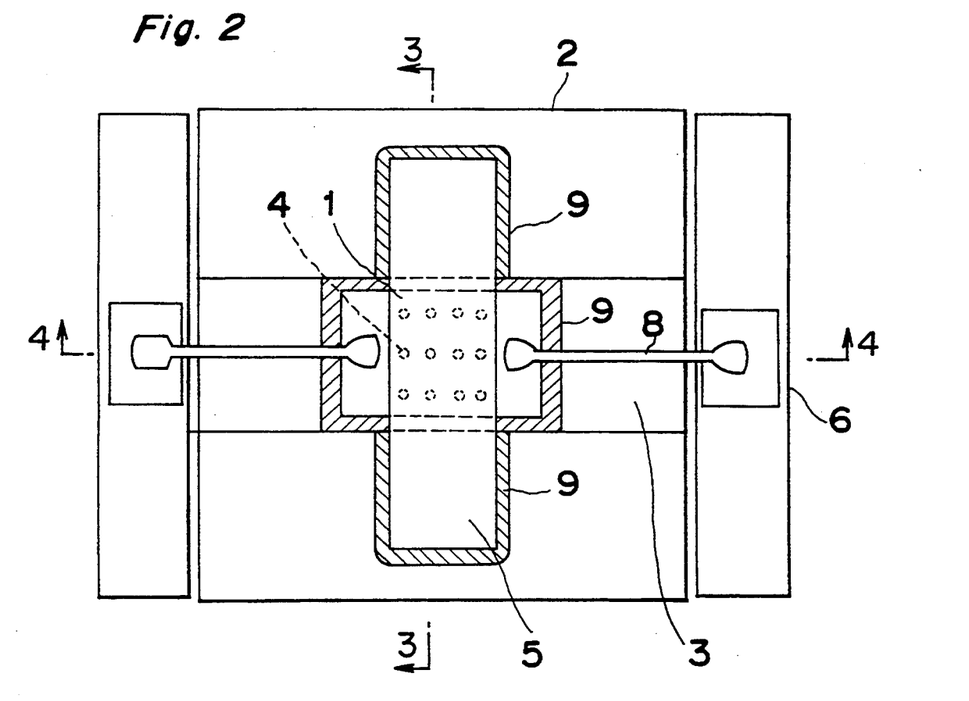
FIG. 2 is a top plane view of the semiconductor apparatus of FIG. 1.
Figure 3:
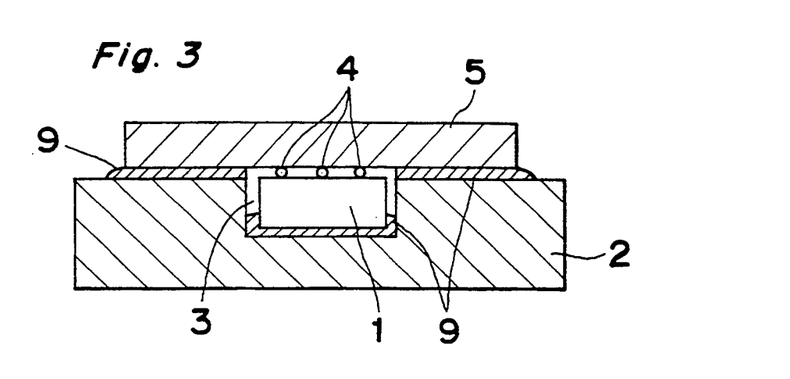
FIG. 3 is a cross-sectional view taken along a line of A-A' of FIG. 2.
Figure 4:
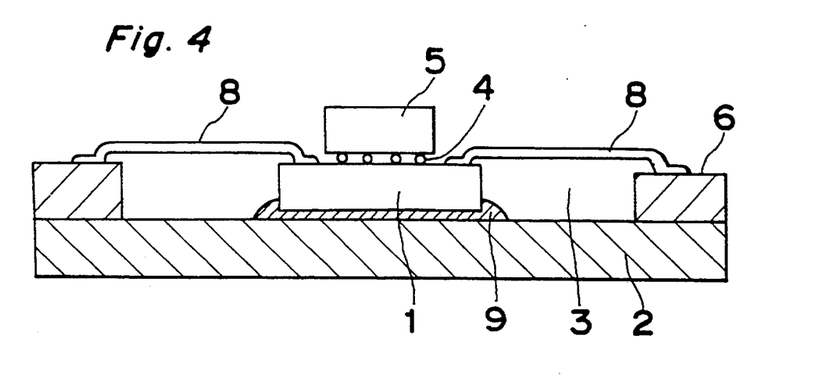
FIG. 4 is a cross-sectional view taken along a line of B-B' of FIG. 2.

A semiconductor apparatus in accordance with a first embodiment of the present invention will be described hereinafter with reference to the drawings by way of an example of a npn emitter up type HBT for microwave power amplification use. FIG. 1 is a bird's eye typical view of the semiconductor apparatus, and FIGS. 2 to 4 are three-face schematic views thereof. As shown in these drawings, a semiconductor chip 1 including elements (not shown) each having an emitter, a collector and a base is engaged on a groove shaped open hole portion 3 provided in an integrally molded non-oxygen-copper made heat sink 2, which also functions as a package pedestal, with the highest portion being almost in height alignment with the connecting portions of a plurality of bumps 4 around the semiconductor chip 1. The bumps 4 are connected respectively with the emitters of the element within the semiconductor chip 1 by a metallic pattern built on the semiconductor chip 1, and with a copper made connecting member 5 connected with the heat sink 2 by the silver paste 9 so that the bumps 4 may be spliced with both of them, i.e. the semiconductor chip 1 and connecting member 5 thermally and electrically. The base collector of each element are connected respectively with external outgoing electrode 7 for the base and collector used with metallic patterns respectively built on the semiconductor chip 1.

A method of making the semiconductor apparatus will be described in order.

Figure 9:
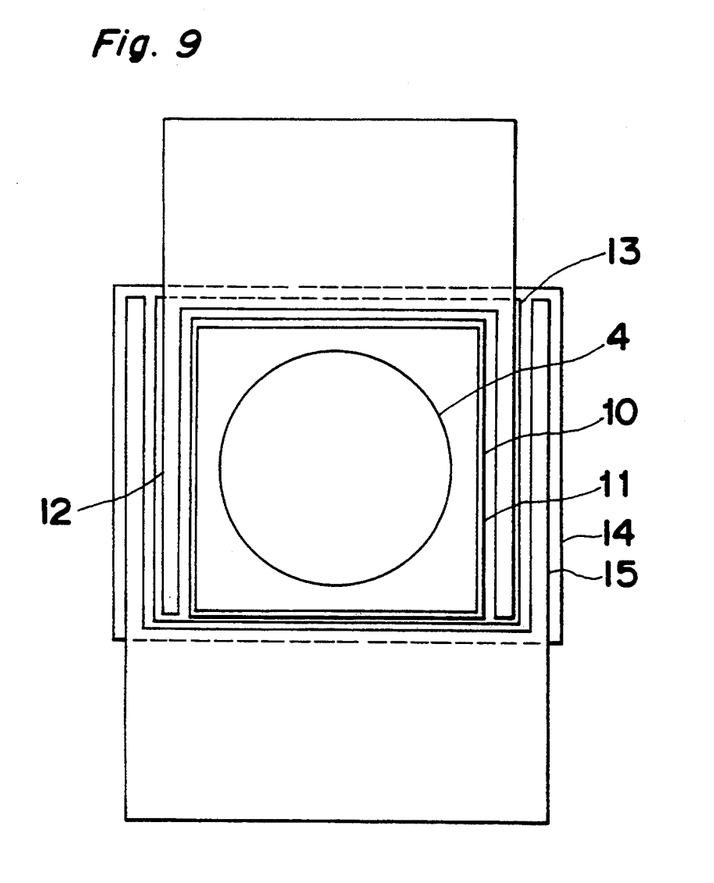
FIG. 9 is a top plane view with an enlarged scale, showing a portion of the semiconductor apparatus of FIG. 8.
Figure 10:
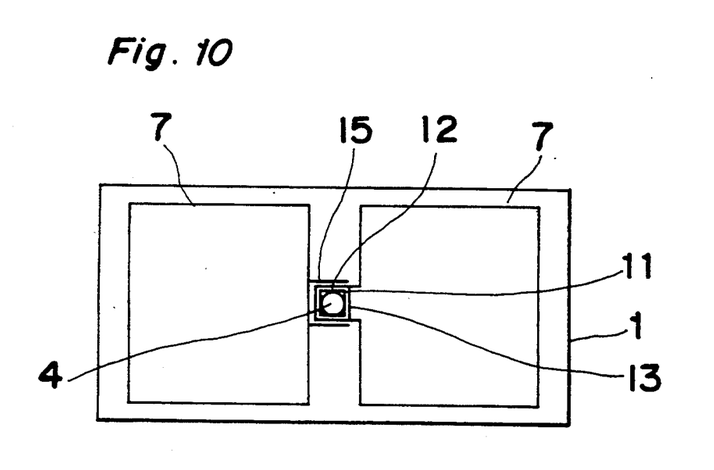
FIG. 10 is a schematic view showing an arrangement of a single transistor provided on a chip to be employed in the semiconductor apparatus for an embodiment of the present invention.

First, by the use of a well known method, for example, disclosed within "Electronic Communication Society Technical Research Report ED90 - 135", the semiconductor chip 1 of an npn emitter up type HBT of AlGaAs/GaAs is formed on the semi-insulating basic plate. For instance, the size of emitter electrode 11 is a square of 25 $\mu$m and a base electrode 12 and a collector electrode 15 are respectively provided at both sides of the emitter electrode 11 in relationship with an emitter layer 10, a base layer 13 and a collector layer 14, as shown in FIGS. 9 and 10. Thereafter, polyimide is used as a layer insulating film, each electrode top of the base and collector is covered so as to open in the emitter immediate top portion. The contact portion to the base and collector are drawn out with the use of the metal wiring, and the respective outgoing electrodes 7 are provided in the separate locations. Thereafter, on the employment of a conventional method such as a photolithography lift-off process and the like, a protective electrode composed of Ti/Pt/Au is formed in a pattern of an approximate circular shape immediately on the transistor element. Also, $SiN_x$ is accumulated as a passivation film and opens in a portion where the bump electrode is provided on the respective outgoing electrode portion of the above described base and collector by photo-lithography and buffer fluorine acid etching. Then, a protective resist is applied, and a circular opening is provided in an inner edge portion of the Ti / Pt / Au on the immediate top of the transistor element where the bump electrode should be provided by photo-lithography. Thereafter, the Ti is evaporated on the whole face to make a plating electrode for supplying an electric power. Also, bump plating resist is applied so as to open only a portion where the bump electrode is provided, with the use of the photo-lithography art. Then the Au bump 4 is formed by a plating method. In this case, the plating of the Au is made larger in thickness than the bump plating resist so as to make the diameter of the head portion of the bump larger than the diameter of the lower portion. Thereafter, the bump plating resist is removed. Continuously, the Ti except for the bump immediate bottom is removed by the lift off by the protective resist, and lapping and dicing are performed by the normal method so as to complete the semiconductor chip, as shown in FIGS. 9 and 10.

Figure 8:
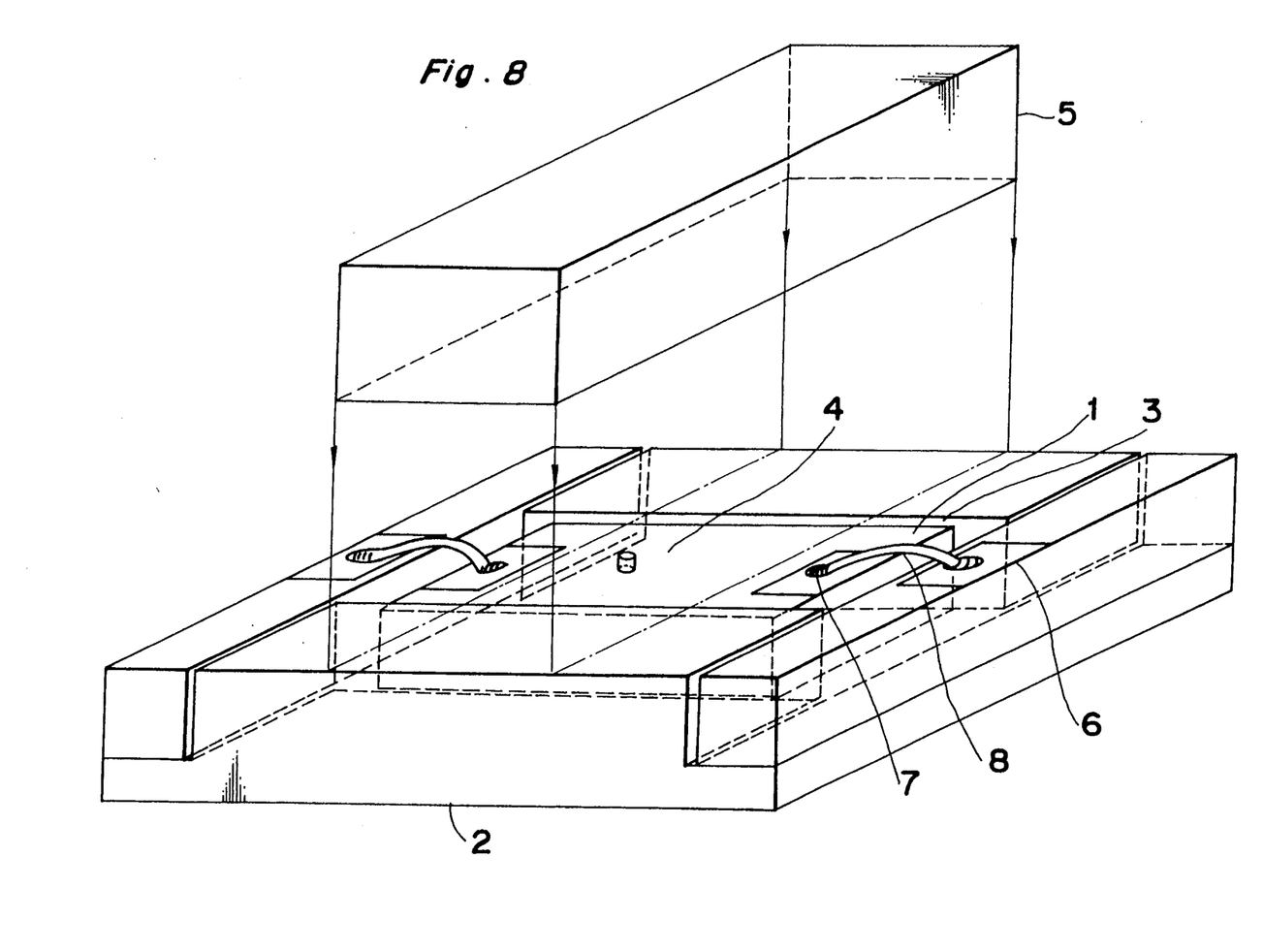
FIG. 8 is a perspective view, partly exploded, showing a semiconductor apparatus in accordance with a third embodiment of the present invention.

The semiconductor chip shown in FIGS. 9 and 10 is provided with three terminal electrodes which are connected with the respective splicing technique. The semiconductor chip 1 shown in FIG. 1 provides on a single base plate a plurality of HBT elements, wherein base electrodes for each of the respective elements are drawn out at the one ends to form a single electrode at one side, collector electrodes for each of the respective elements are also drawn out at one ends to form a single electrode at the other side, and emitter electrodes for each of the respective elements are drawn out at one ends to portion at the center portion on which the bump is provided. The semiconductor chip 1 shown in FIG. 8 provides on a single base plate a single HBT element having base, collector and emitter electrodes.

A copper block with tin being plated on the surface thereof is prepared as a connecting member 5. The bump 4 of the semiconductor chip 1 is fixed with thermal pressure adherence on the semiconductor chip 1 with the use of the normal flip chip bonder so that the bump 4 may become orthogonal to the connecting member 5.

A power transistor package, which is completely the same as the normal one, is prepared except for the groove shaped open hole portion 3 that is slightly wider in space than the short side of the semiconductor chip 1 and is slightly larger in width than the depth which is a sum of the thickness of the semiconductor chip 1 and the height of the bump 4. The heat sink portion 2 of the package is made of non-oxygen-copper and is provided with a port 6 for drawing out the base and the collector, the port 6 being insulated from the heat sink portion 2. A proper amount of epoxide silver paste 9 is applied upon the bottom face of the groove shaped open hole portion 3 of the package and a portion where the connecting member 5 is to be bonded. Thereafter, the semiconductor chip 1 and the connecting member 5 thermally pressure adhered to the semiconductor chip 1 are mounted so that the semiconductor chip 1 may just drop into the groove open hole portion 3 so as to dry and the sliver paste 9 is solidified in a hot blast furnace at a temperature of 150° C. for a time of 30 minutes.

Thereafter, each electrode 7 for drawing out from the base and the collector, and the port 6 of the package are respectively connected respectively with a metallic wire 8 by the use of the normal wire bonder. The production for the semiconductor apparatus of the present embodiment is completed with the above described procedure.

Figure 5:
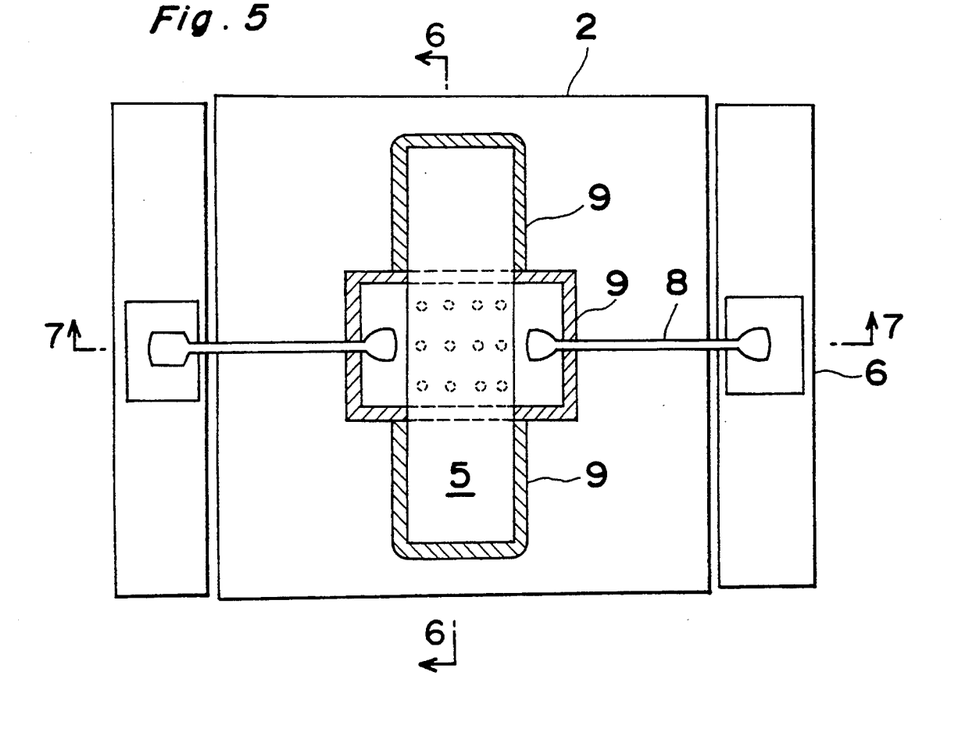
FIG. 5 is a similar view of FIG. 2 showing a modification of the semiconductor apparatus of FIG. 1 in accordance with a second embodiment of the present invention.
Figure 6:
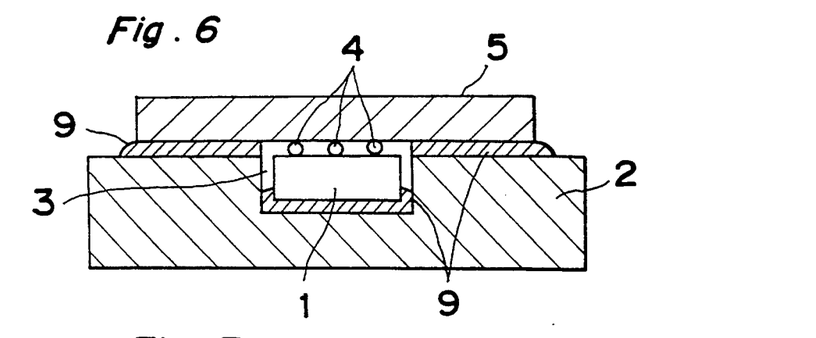
FIG. 6 is a cross-sectional view taken along a line of A-A' of FIG. 5.
Figure 7:
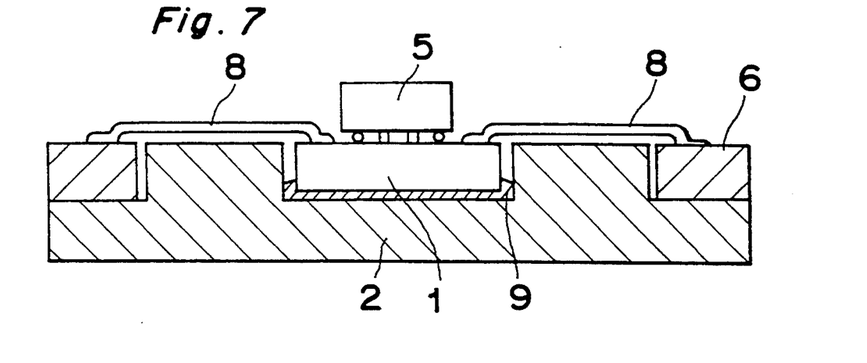
FIG. 7 is a cross-sectional view taken along a line of B-B' of FIG. 5.

FIGS. 5 to 7 show a modification of the first embodiment, wherein the shape of the open hole portion 3 for mounting the semiconductor chip 1 therein is changed from the groove open hole portion 3 of FIGS. 1 to 4 to a recess of a cross shape in the top plane of FIG. 5 with the same height in the side planes of FIGS. 6 and 7.

Also, FIGS. 8 to 10 show another modification of the first embodiment, wherein the semiconductor chip 1 is provided with a single element together with a single bump 4 which is applied with a connecting member 5 in the same manner of the plural bump 4 of the first embodiment.

As mentioned above, the present embodiment, the collector, base and emitter are formed on the semiconductor basic plate in this order. On the other hand, the emitter, base and the collector may be formed on the semiconductor basic plate in this order. Also, a conductive type of semiconductor layer may be inverted from the conductive type in the embodiment. Even in the construction of the bipolar transistor, a so-called single heterobipolar transistor (SHBT) with only the emitter being large in band gap, and a so-called double heterobipolar transistor (DHBT) may be used with a wide band gap material being used even in the collector. A method of reducing $C_{bc}$ by injection of $O+$, $B+$, $H_+$ ions and so on just under the external portion base, or a combination of a separating method between elements by an ion injection can be effected.

In the present embodiment, a HBT is used as an active element. Without restriction to the HBT, the used element may be the normal bipolar transistor, a thyristor, a HET (Hot Electron Transistor), a resonance tunnel transistor or the like as, for example, a vertical type construction element, a horizontal type construction element, an FET (Field Effect Transistor), a horizontal bipolar transistor, a HEMT (High Electron Mobility Transistor) or the like. Also, the combination of them, or the combination of light emitting and light receiving elements can be effected, needless to say.

Although the transistor for the microwave power amplifying use is provided by way of example, an application can be effected, needless to say, even for MMIC, integrating circuit for supersonic speed use or the like. In the present embodiment, the bump electrode achieves a part as an emitter electrode. However, in the use of, for example, MMIC (Monolithic Microwave IC) for handling high power supersonic integrating circuit or the like, the bump electrode may be inconvenient as the emitter (source). In such a case, the bump electrode may be used only for the use of thermal radiation by a method of connection with the base (gate) or the collector (drain), or of interposing the insulating film without use as the electrode.

In the present embodiment, a face to be connected with the reverse face of the semiconductor chip becomes directly a heat sink, but the whole or one portion including the portion and the connecting point of the electrode portion to be drawn out from the chip surface may be reversed above and below.

The semiconductor chip to be used is not restricted to the present embodiment (GaAs). It may be composed of the other chemical semiconductors such as InP, SiC, GaP and so on, and element semiconductors such as C, Si and so on. Also, elements themselves may be of the other grid matching systems such as InGaAs/InAlAs system, InGaAs/InP system or the like or grid mismatching systems such as InGaAs/AlGaAs or the like, needless to say.

In the present embodiment, although a cooper block is used as a connecting member, another material may be used, needless to say, if it is a material which is good in thermal conductivity.

As is clear from the foregoing description, according to the arrangement of the present invention, a semiconductor apparatus, which can radiate the heat from both the surface of the reverse face of the semiconductor chip, is obtained by a mounting method, which is extremely simple and larger in margin. Accordingly, by the present invention, a semiconductor apparatus, which is lower in thermal resistance and better in yield is obtained. Therefore, the semiconductor apparatus can be formed with low cost.

The present invention can sharply reduce the thermal resistance of the semiconductor apparatus. The industrial far-reaching effects are considerable especially in the practical use of the HBT for amplifying the microwave power.

Although the present invention has been fully described by way of example with reference to the accompanying drawings, it is to be noted here that various changes and modifications will be apparent to those skilled in the art. Therefore, unless such changes and modifications otherwise depart from the scope of the present invention, they should be construed as included therein

What is claimed is:

1. A semiconductor apparatus comprising:
   a semiconductor chip having a plurality of electrodes including a first type of terminal electrodes and a second type of terminal electrodes;
   a heat sink formed with a recess portion for disposing said semiconductor chip within said recess portion, wherein said plurality of terminal electrodes of said semiconductor chip are provided on a top plane thereof which is opposite to a bottom surface of said recess portion;
   at least one bump provided on said top plane of said semiconductor chip contacting with said first type of terminal electrodes; and
   a connecting member having a heat conductivity for radiating heat generated in said semiconductor chip to an outside region of said semiconductor chip, where said connecting member is so positioned as to contact with said at least one bump directly and connected to said semiconductor chip via said at least one bump, while said second type of terminal electrodes are uncovered by said connecting member, wherein said connecting member is connected with said heat sink.

2. The semiconductor apparatus as defined in claim 1, wherein a first contact area provided between said connecting member and said at least one bump is larger than a second contact area between said semiconductor chip and said bump.

3. The semiconductor apparatus as defined in claim 1, wherein said connecting member is made of a metal plate.

4. The semiconductor apparatus as defined in claim 1, wherein a surface of said connecting member including all contact portions with respect to said bumps is a flat surface.

5. The semiconductor apparatus as defined in claim 1, further comprising outside ports to which said second type of terminal electrodes are connected.

6. The semiconductor apparatus as defined in claim 1, wherein said recess portion of said heat sink is groove shaped.

7. A semiconductor apparatus comprising:
   a semiconductor chip provided with a plurality of terminal electrodes and outgoing electrodes on a top plane thereof, said plurality of terminal electrodes corresponding to elements of said semiconductor chip;
   a base plate having first and second ports and a recess for mounting said semiconductor chip therein with said top plane disposed to an outside region of said recess so as to position the plurality of terminal electrodes to be connected at an external source to said base plate;
   a bump provided on one of the terminal electrodes for each of said elements;
   a first connecting member having heat conductivity for radiating heat from said semiconductor chip, disposed over said top plane of said semiconductor chip and having a bottom plane connected with said top plane of said semiconductor chip by said bump and connected with said base plate, the outgoing electrodes being positioned outside of said first connecting member on said top plane of said semiconductor chip and are uncovered by said first connecting member; and
   second and third connecting members for connecting the outgoing electrodes to said first and second ports.

8. A semiconductor apparatus comprising:
   a semiconductor chip provided with a plurality of terminal electrodes and outgoing electrodes on a top plane thereof, wherein said plurality of terminal electrodes correspond to emitters, collectors and bases for elements of said semiconductor chip;
   a base plate having first and second ports and a recess for mounting the semiconductor chip therein with said top plane disposed to an outside region of said recess so as to position said plurality of terminal electrodes to be connected at an external source to said base plate, said first and second ports for externally connecting terminal electrodes corresponding to said bases and collectors for said elements of said semiconductor chip;

a bump provided on said terminal electrode for said emitter;

a connecting member having heat conductivity for radiating heat from said semiconductor chip, disposed over said top plane of said semiconductor chip and having a bottom plane connected with said top plane of said semiconductor chip by said bump, the outgoing electrodes connected to said emitters and bases being positioned outside of said connecting member and are uncovered by said connecting member; and first and second wires for wire-bonding respectively with said outgoing electrodes to said collectors and bases and said first and second ports of said base plate.

* * * * *